(12) United States Patent
Kawakami et al.

(10) Patent No.: US 9,202,940 B2
(45) Date of Patent: Dec. 1, 2015

(54) SEMICONDUCTOR DEVICE

(75) Inventors: Tsuyoshi Kawakami, Tokyo (JP);
Yoshiyuki Nakaki, Tokyo (JP); Yoshio Fujii, Tokyo (JP); Hiroshi Watanabe, Tokyo (JP); Shuhei Nakata, Tokyo (JP); Kohei Ebihara, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/239,375

(22) PCT Filed: Jul. 31, 2012

(86) PCT No.: PCT/JP2012/069407
§ 371 (c)(1),
(2), (4) Date: Feb. 18, 2014

(87) PCT Pub. No.: WO2013/046908
PCT Pub. Date: Apr. 4, 2013

(65) Prior Publication Data
US 2014/0203393 A1    Jul. 24, 2014

(30) Foreign Application Priority Data

Sep. 28, 2011    (JP) ................. 2011-211980

(51) Int. Cl.
*H01L 29/06*    (2006.01)
*H01L 29/872*    (2006.01)
(Continued)

(52) U.S. Cl.
CPC ........ *H01L 29/8725* (2013.01); *H01L 29/0619* (2013.01); *H01L 29/0623* (2013.01); *H01L 29/8611* (2013.01); *H01L 29/872* (2013.01); *H01L 29/1608* (2013.01)

(58) Field of Classification Search
CPC ............ H01L 29/0619; H01L 29/0623; H01L 29/063; H01L 29/0634
See application file for complete search history.

(56) References Cited

U.S. PATENT DOCUMENTS 3,971,059 A * 7/1976 Dunkley et al. ............... 257/549
4,027,325 A * 5/1977 Genesi .......................... 257/547
(Continued)

FOREIGN PATENT DOCUMENTS

JP        03147331 A   *  6/1991
JP        2002 231965     8/2002
(Continued)

OTHER PUBLICATIONS

International Preliminary Report on Patentability and Written Opinion issued Apr. 10, 2014 in PCT/JP2012/069407 with English language translation.

(Continued)

*Primary Examiner* — Michele Fan
(74) *Attorney, Agent, or Firm* — Oblon, McClelland, Maier & Neustadt, L.L.P.

(57) ABSTRACT

A semiconductor device having high breakdown voltage and high reliability without forming an embedded injection layer with high position accuracy. The semiconductor device includes a base as an active area of a second conductivity type formed on a surface layer of a semiconductor layer of a first conductivity type to constitute a semiconductor element; guard rings as a plurality of first impurity regions of the second conductivity type formed on the surface layer of the semiconductor layer spaced apart from each other to respectively surround the base in plan view; and an embedded injection layer as a second impurity region of the second conductivity type embedded in the surface layer of the semiconductor layer to connect at least two bottom portions of the plurality of guard rings.

13 Claims, 7 Drawing Sheets

(51) Int. Cl.
*H01L 29/861* (2006.01)
*H01L 29/16* (2006.01)

(56) References Cited

U.S. PATENT DOCUMENTS

| | | | |
|---|---|---|---|
| 4,673,964 A * | 6/1987 | Popovic et al. | 257/427 |
| 6,096,618 A * | 8/2000 | Dunn et al. | 438/328 |
| 6,191,466 B1 * | 2/2001 | Yamashita et al. | 257/481 |
| 6,525,394 B1 * | 2/2003 | Kuhn et al. | 257/509 |
| 6,831,345 B2 | 12/2004 | Kinoshita et al. | |
| 7,049,675 B2 | 5/2006 | Kinoshita et al. | |
| 7,737,469 B2 | 6/2010 | Saito et al. | |
| 8,013,360 B2 | 9/2011 | Saito et al. | |
| 8,404,526 B2 | 3/2013 | Sasaki | |
| 8,421,152 B2 | 4/2013 | Sasaki | |
| 2003/0052329 A1 * | 3/2003 | Kobayashi et al. | 257/135 |
| 2003/0218220 A1 * | 11/2003 | Takahashi et al. | 257/409 |
| 2005/0280086 A1 * | 12/2005 | Saito et al. | 257/341 |
| 2006/0170075 A1 * | 8/2006 | Takahashi | 257/580 |
| 2007/0145489 A1 * | 6/2007 | Yeh et al. | 257/370 |
| 2009/0045481 A1 * | 2/2009 | Niimura et al. | 257/495 |
| 2009/0294865 A1 * | 12/2009 | Tang et al. | 257/369 |
| 2010/0264507 A1 * | 10/2010 | Takahashi et al. | 257/491 |
| 2010/0289110 A1 * | 11/2010 | Tarui et al. | 257/490 |
| 2011/0204469 A1 * | 8/2011 | Onishi | 257/490 |
| 2012/0126315 A1 * | 5/2012 | Onishi et al. | 257/329 |
| 2013/0214291 A1 * | 8/2013 | Uchida et al. | 257/77 |

FOREIGN PATENT DOCUMENTS

| | | | |
|---|---|---|---|
| JP | 2003 101039 | | 4/2003 |
| JP | 3708057 | | 8/2005 |
| JP | 2006210667 A | * | 8/2006 |
| JP | 2006 269633 | | 10/2006 |
| JP | 2007266123 A | * | 10/2007 |
| JP | 2008 004643 | | 1/2008 |
| JP | 2008 147362 | | 6/2008 |
| JP | 2010 67737 | | 3/2010 |
| JP | 2011018751 A | * | 1/2011 |
| JP | 2011071160 A | * | 4/2011 |
| WO | WO 2009116444 A1 | * | 9/2009 |

OTHER PUBLICATIONS

International Search Report Issued Nov. 6, 2012 in PCT/JP12/069407 filed Jul. 31, 2012.

* cited by examiner

F I G. 4
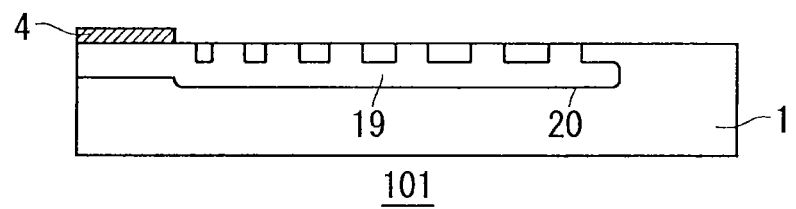
F I G. 5
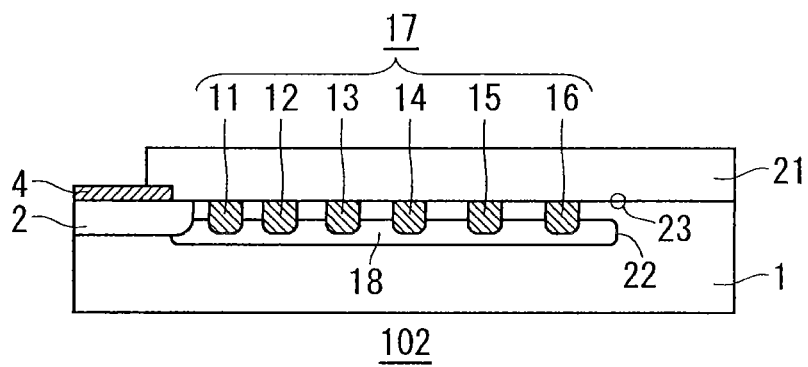

F I G. 6

| CONCENTRATION PROFILE OF ADDITIONAL INJECTION LAYER | INJECTION DEPTH OF ADDITIONAL INJECTION LAYER | MAXIMUM ELECTRIC FIELD INSIDE SEMICONDUCTOR SUBSTRATE | SUBSTRATE SURFACE ELECTRIC FIELD AT END OF TERMINATION STRUCTURE | |
|---|---|---|---|---|
| | | | WITHOUT ADSORPTION CHARGE | ADSORPTION CHARGE $-2 \times 10^{12}$ cm$^{-2}$ |
| NO ADDITIONAL INJECTION LAYER | — | 3.64 MV/cm | — | — |
| RETROGRADE PROFILE (EMBEDDED) | EQUAL TO BASE / GUARD RING | 3.02 MV/cm | 0.80 MV/cm | 1.23 MV/cm |
| BOX PROFILE | DEEPER THAN BASE / GUARD RING | 2.72 MV/cm | 0.77 MV/cm | 1.19 MV/cm |
| RETROGRADE PROFILE (EMBEDDED) | DEEPER THAN BASE / GUARD RING | 2.68 MV/cm | 0.67 MV/cm | 1.05 MV/cm |

F I G. 1 6
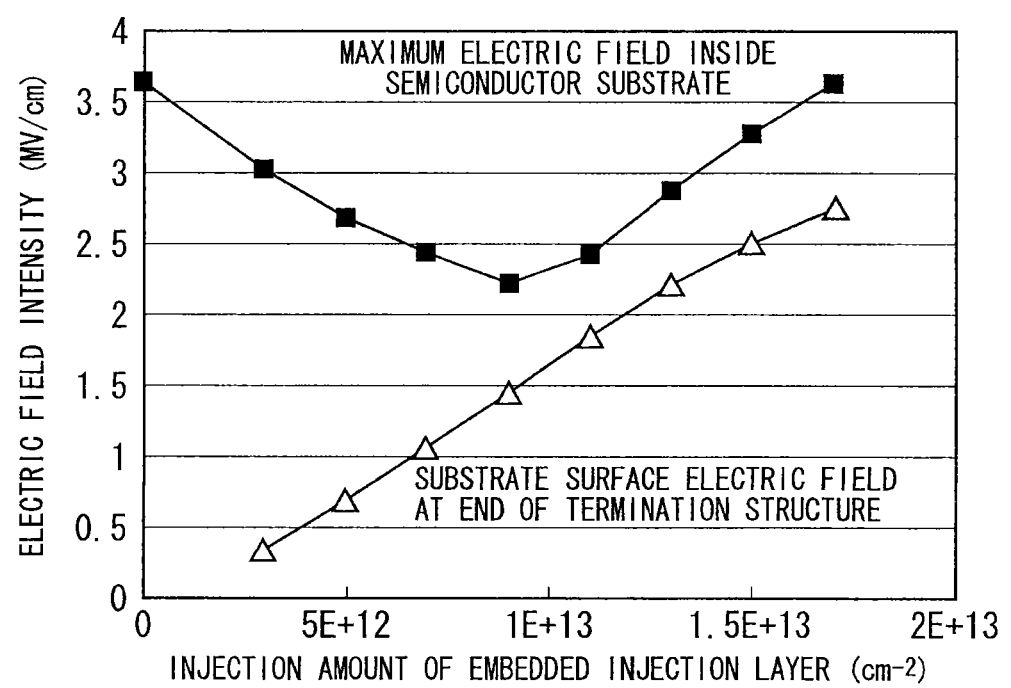

SEMICONDUCTOR DEVICE

TECHNICAL FIELD

The present invention relates to semiconductor devices, and in particular, to a semiconductor device including a terminating end region for improving breakdown voltage performance at an outer peripheral portion of an element.

BACKGROUND ART

A breakdown voltage of a semiconductor device that is represented by a diode, a MOSFET (Metal-Oxide-Semiconductor Field-Effect-Transistor), and an IGBT (Insulated Gate Bipolar Transistor) includes a reverse breakdown voltage of a diode and an off-breakdown voltage of a transistor, which are both breakdown voltages in a state where the semiconductor element does not function as an active element. In the state where the semiconductor element does not function as the active element, the voltage applied to the semiconductor device is held by a depletion layer that spreads in a semiconductor substrate provided with the element.

As a technique for improving the breakdown voltage performance of the semiconductor device, there is known a technique of arranging a terminating end region including an impurity injection layer of a conductivity type opposite to the semiconductor substrate so as to surround an active area serving as an active element in the semiconductor substrate.

As a structure of the terminating end region (termination structure), there is known a structure of forming, on the outer side of the active area, the impurity injection layer of a conductivity type opposite to the semiconductor substrate in layers so as to be spaced apart from each other toward the outer side. Since the impurity injection layer has an annular shape when the semiconductor device is viewed from above, it is called a guard ring or an FLR (Field Limiting Ring). In the present invention, the structure refers to the entire plurality of guard rings, and is called a guard ring structure.

When such a guard ring structure is arranged, the depletion layer easily spreads toward the outer side of the active area. As a result, the electric field concentration at the bottom end portion of the active area (corner portion of the injection layer when viewed in cross-section) is alleviated, and the breakdown voltage of the semiconductor device can be improved.

In transistors such as MOSFET, IGBT, and the like, the outermost portion of the active area normally becomes a deep impurity injection layer (well) of a conductivity type opposite to the semiconductor substrate. Thus, the guard ring is often formed simultaneously with the well. This is similar in the PIN (P-Intrinsic-N) diode, and the guard ring is normally formed simultaneously with the impurity injection layer (base) that becomes the active area.

As described above, the role of the guard ring structure is to spread the depletion layer toward the outer side of the active area. However, along with this, the electric field concentration occurs not only at the bottom end portion of the active area but also at the outer side bottom end portion of the individual guard ring. Such an electric field concentration tends to become stronger as the change in impurity concentration in the vicinity of the PN junction surface becomes steeper.

Since the well and the base have a relatively high concentration, the change in concentration in the vicinity of the PN junction surface becomes steeper, and strong electric field concentration tends to easily occur. Thus, in Si (silicon), the impurity diffusion is normally promoted by anneal processing performed at high temperature for a long time to make the change in concentration in the vicinity of the PN junction surface gradual, thus alleviating the electric field concentration.

Alternatively, an embedded injection layer having a relatively low concentration may be formed at the bottom end portion of the active area and the outer side bottom end portion of the individual guard ring to change the concentration in a step-wise manner, thus alleviating the electric field concentration. Such prior art is described in Patent Document 1.

In addition, as techniques related to the termination structure, there are techniques disclosed in Patent Document 2 and Patent Document 3.

PRIOR ART DOCUMENT

Patent Document

Patent Document 1: Japanese Patent Application Laid-Open No. 2008-4643
Patent Document 2: Japanese Patent Application Laid-Open No. 2002-231965
Patent Document 3: Japanese Patent No. 3708057

SUMMARY OF THE INVENTION

Problems to be Solved by the Invention

Generally, in the guard ring structure, the guard ring that is not connected to the depletion layer cannot hold a voltage. That is, although the depletion layer needs to be connected to the outermost guard ring in order to bring out the performance of the guard ring structure to the utmost extent, the stretch of the depletion layer spreading from the individual guard ring tends to be affected by disturbance (fixed charge, adsorption charge, external electric field) since the individual guard ring has a floating potential. This is similar in Patent Document 1.

According to Patent Document 1, the electric field concentration at the bottom end portion of the active area and the outer side bottom end portion of the individual guard ring can be alleviated without using impurity diffusion. Thus, it appears to be effective in semiconductor materials such as SiC (silicon carbide) in which the impurity diffusion length is extremely short.

However, the stretch of the depletion layer is small since the substrate concentration is high in a wide band gap semiconductor such as SiC. Thus, the interval of the individual guard ring needs to be narrowed to less than a few μm. It is difficult to accurately form the embedded injection layer as in Patent Document 1 under such circumstances.

The present invention has been made in view of solving the above problems, and an object thereof is to provide a semiconductor device having high breakdown voltage and high reliability without forming the embedded injection layer with high position accuracy.

Means for Solving the Problems

A semiconductor device according to the present invention includes an active area of a second conductivity type formed on a surface layer of a semiconductor layer of a first conductivity type to constitute a semiconductor element; a plurality of first impurity regions of the second conductivity type formed on the surface layer of the semiconductor layer spaced apart from each other so as to respectively surround the active area in plan view; and a second impurity region of the second conductivity type embedded in the surface layer of the semiconductor layer to connect at least two bottom portions of the plurality of first impurity regions.

Effects of the Invention

According to the semiconductor device of the present invention, since an active area of a second conductivity type formed on a surface layer of a semiconductor layer of a first conductivity type to constitute a semiconductor element; a plurality of first impurity regions of the second conductivity type formed on the surface layer of the semiconductor layer spaced apart from each other so as to respectively surround the active area in plan view; and a second impurity region of the second conductivity type embedded in the surface layer of the semiconductor layer to connect at least two bottom portions of the plurality of first impurity regions are arranged, the semiconductor device having high breakdown voltage and high reliability can be provided without forming the embedded injection layer with high position accuracy.

These and other objects, features, aspects and advantages of the present invention will become more apparent from the following detailed description of the present invention when taken in conjunction with the accompanying drawings.

BRIEF DESCRIPTION OF DRAWINGS

FIG. 4 is a cross-sectional view showing the configuration of the semiconductor device of the first embodiment according to the present invention.

FIG. 5 is a cross-sectional view showing the configuration of the semiconductor device of the first embodiment according to the present invention.

FIG. 6 is a view showing effects of the semiconductor device of the first embodiment according to the present invention.

FIG. 16 is a view showing effects of the semiconductor device of the first embodiment according to the present invention.

DESCRIPTION OF EMBODIMENTS

Figure 1:
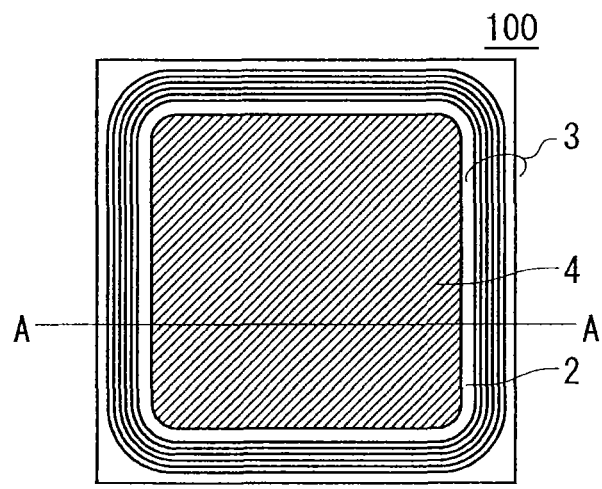
FIG. 1 is a plan view showing a configuration when the present invention is applied to a PIN diode.
Figure 2:
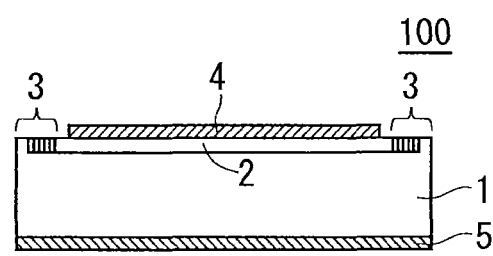
FIG. 2 is a cross-sectional view showing a configuration when the present invention is applied to the PIN diode.

FIG. 1 is a plan view showing a configuration of a diode 100 when the present invention is applied to a diode, and FIG. 2 is a cross-sectional view showing a cross-section taken along line A-A in FIG. 1.

As shown in FIG. 1 and FIG. 2, in the diode 100, an active area (base 2) constituted by an injection layer containing a P-type (second conductivity type) impurity at a relatively high concentration is formed on a surface of a semiconductor substrate 1 (semiconductor layer) containing an N-type (first conductivity type) impurity at a relatively low concentration, and a termination region 3 constituted by a plurality of P-type injection layers is formed so as to surround the base 2.

An anode electrode 4 is arranged on the base 2, and as shown in FIG. 2, a cathode electrode 5 is arranged on a surface (back surface of the substrate) opposite to a main surface on which the anode electrode 4 is formed.

In such a configuration, the semiconductor device functions as a PIN diode by applying a bias voltage between the anode electrode 4 in contact with the base 2 and the cathode electrode 5 on the back surface of the substrate.

Hereinafter, a termination structure which is a surface structure of the termination region will be mainly described as an embodiment of the semiconductor device according to the present invention.

First Embodiment

Configuration

Figure 3:
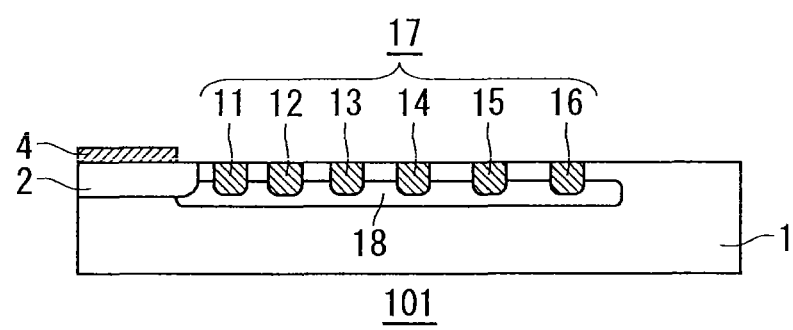
FIG. 3 is a cross-sectional view showing a configuration of a semiconductor device of a first embodiment according to the present invention.

FIG. 3 is a cross-sectional view showing a structure of a termination structure 101 according to a first embodiment of the present invention.

A guard ring structure 17 (first impurity region) that is of the second conductivity type same as the base 2 and that includes guard rings 11 to 16 having the same concentration is formed so as to surround the base 2 formed as in FIG. 1 and FIG. 2. The guard rings 11 to 16 are formed spaced apart from each other, and are formed on the surface of the semiconductor substrate 1 to surround the base 2 in plan view.

The bottom end portion of the base 2 as the active area and the bottom portions of the guard rings 11 to 16 (first impurity region) are connected by an embedded injection layer 18 (second impurity region), which is a P-type (second conductivity type) injection layer injected deeper than the base 2 and having a concentration lower than the guard rings 11 to 16. In the figure, the bottom portions of all the guard rings 11 to 16 are connected by the embedded injection layer 18.

The base 2 and the guard rings 11 to 16 have concentration profiles in which the concentration of the most superficial surface is particularly high in order to obtain an ohmic contact between the base 2 and the anode electrode 4. The guard rings 11 to 16 are arranged to surround the base 2 in plan view such that the spaced distance between each other gradually becomes larger with the end of the base 2 as the reference.

The embedded injection layer 18 has a concentration profile in which the concentration of the surface of the semiconductor substrate 1 is very low and the concentration in the vicinity of the bottom portions (injection depth, PN junction depth) of the base 2 and the guard rings 11 to 16 is the maximum, that is, a retrograde profile, and thus can be assumed as a layer embedded inside the semiconductor substrate 1.

Therefore, the injection depth of the embedded injection layer 18 shown in FIG. 3 is distributed to positions deeper than the bottom portions of the base 2 and the guard rings 11 to 16, with these bottom portions as the center. The embedded injection layer 18 as the second impurity region is then connected to the bottom portion of the base 2 as the active area.

The embedded injection layer 18 can be formed by high energy impurity injection (high energy ion injection), n-type epitaxial film growth after injecting impurities, and the like. When forming the embedded injection layer 18 with the former process, the surface of the semiconductor substrate 1 may slightly become P-type, but problems do not arise. When forming the embedded injection layer 18 with the latter process, the base 2 and the guard rings 11 to 16 are formed after the embedded injection layer 18 is formed.

The injection amount (injection area density) of the embedded injection layer 18 may be set to be completely depleted when a reverse voltage of about half the rated voltage is applied to the semiconductor device. The desired injection amount of the embedded injection layer 18 is about 0.4 to 0.9 times the resurf condition determined by the semiconductor material. Note that the resurf condition is approximately $1\times10^{12}$ cm$^{-2}$ in Si, and approximately $1\times10^{13}$ cm$^{-2}$ (in the case of activation rate 100%) in SiC of 4H polytype.

It is desirable that the embedded injection layer 18 (second impurity region) stretches out to the outer side of the guard ring 16 to protect the outer side bottom end portion of the guard ring 16 (first impurity region), which surrounds the base 2 as the active area from the outermost side.

Although FIG. 3 shows one cross-section (cross-section taken along line A-A in FIG. 1), a plurality of locations having the cross-sectional structure as shown in FIG. 3 may be provided in the termination region 3 surrounding the base 2 as in FIG. 1. That is, the embedded injection layer 18 is radially formed from the base 2 which is the active area.

According to such a configuration, the base 2, the guard rings 11 to 16, and the embedded injection layer 18 have the same potential at the time of zero bias.

When a reverse voltage is applied, as schematically shown in FIG. 4, the depletion layer stretches from a PN junction surface 20 which is a boundary between a P-type region 19 and the semiconductor substrate 1 (drift layer).

That is, from the time of zero bias, the depletion layer is connected to the guard ring 16 which is the guard ring positioned on the outermost side from the base 2. After the reverse voltage is increased and the embedded injection layer 18 is completely depleted, part of the guard rings 11 to 16 is depleted so that the depletion in the semiconductor substrate 1 extends.

That is, according to such a configuration, the guard ring that does not hold a voltage is not produced even if disturbance occurs.

The above effects can be obtained even if, instead of the embedded injection layer 18, the base 2 and the guard rings 11 to 16 are connected with an impurity layer having a Gaussian profile with the maximum concentration at the surface of the semiconductor substrate 1, or even if the base 2 and the guard rings 11 to 16 are connected with an impurity layer having a box profile in which the concentration from the surface to a predetermined depth is constant.

A description will be made below on the effects obtained by arranging the embedded injection layer 18 having the retrograde profile described above.

The concentration difference between the bottom portions of the guard rings 11 to 16 and the embedded injection layer 18 can be reduced by positioning the depth at which the embedded injection layer 18 has the maximum concentration in the vicinity of the bottom portion (injection depth, PN junction depth) of the guard rings 11 to 16 (similarly for base 2), that is, by embedding the embedded injection layer 18 inside the semiconductor substrate 1.

By comparing under the constant injection amount, the concentration difference with the concentration of the bottom portions of the guard rings 11 to 16 is smaller in the case of the injection layer having the retrograde profile, that is, the embedded injection layer 18, than in the case of the injection layer having the Gaussian profile or the injection layer having the box profile. Thus, the change in concentration at the layer boundary also becomes smaller in the case of the embedded injection layer 18 having the retrograde profile, and steep change in concentration can be alleviated.

Therefore, according to the configuration of the present invention, the electric field concentration at the bottom end portions of the base 2 and the guard rings 11 to 16 can be effectively alleviated.

Furthermore, a passivation film 21 is normally formed in the termination region (see FIG. 5), and high electric field tends to easily generate at the semiconductor/passivation film interface of the outermost part of the termination structure when negative charges adsorb to the surface of the passivation film 21.

As a result, degradation and breakdown of the passivation film 21 may possibly occur. This becomes a problem particularly in the wide band gap semiconductor such as the SiC in which the insulation breakdown electric field is large (since the insulation breakdown electric field of the wide band gap semiconductor and the passivation film becomes the same order), and is observed in a form of fluctuation or lowering of the breakdown voltage in the electrical characteristics of the semiconductor device.

According to the configuration of the present invention, as shown in FIG. 5, the concentration of the substrate surface of the embedded injection layer 18 is very low, and hence the electric field that generates at a substrate surface 23 (semiconductor/passivation film interface) immediately above an outer side end 22 of the embedded injection layer 18 can be weakened. Thus, the breakdown voltage and the reliability can be improved according to the configuration of the present invention.

FIG. 6 shows the simulation results showing the effects of the two electric field alleviations. Herein, the semiconductor substrate is the SiC of 4H polytype (critical electric field of the SiC of 4H polytype is 3 MV/cm). The simulation model assumes a 1.7 kV withstand voltage product, and the electric field intensity shown in the figure is a value at 1.7 kV.

As shown in FIG. 6, the "maximum electric field inside semiconductor substrate" can be effectively suppressed by the configuration (configuration including the embedded injection layer) of the present invention.

Specifically, the maximum electric field can be suppressed to 2.68 MV/cm when the configuration of the present invention is used, in particular, when the embedded injection layer 18 deeper than the base 2 and the guard rings 11 to 16 is arranged, and is a value lower than when the injection layer itself is not arranged (3.64 MV/cm) or when the injection layer having the box profile is arranged (2.72 MV/cm).

It can also be seen that the "substrate surface electric field at end of termination structure" can also be effectively suppressed.

Specifically, the substrate surface electric field can be suppressed to 0.67 MV/cm (1.05 MV/cm even if there is adsorption charge) when the configuration of the present invention is used, in particular, when the embedded injection layer 18 deeper than the base 2 and the guard rings 11 to 16 is arranged, and is a value less than 0.77 MV/cm (1.19 MV/cm if there is adsorption charge) when the injection layer having the box profile is arranged.

In particular, the effect of suppressing the "substrate surface electric field at end of termination structure" is large, and such effect is maintained even when negative charges are adsorbed to the surface of the passivation film 21. This is a characteristic not described in Patent Document 2 and Patent Document 3.

The appropriate injection amount of the embedded injection layer 18 is about 0.4 to 0.9 times with respect to $1 \times 10^{13}$ cm$^{-2}$, which is the resurf condition of the SiC of 4H polytype (see FIG. 16). If the injection amount is greater, the electric field concentration at the outer side end of the embedded injection layer 18 becomes significantly large, and the resistance with respect to the negative adsorption charge also lowers.

FIG. 16 is the simulation result showing a state of electric field concentration in the embedded injection layer 18, where the vertical axis indicates the electric field intensity (MV/cm) and the horizontal axis indicates the injection amount (cm$^{-2}$) of the embedded injection layer.

As shown in FIG. 16, the maximum electric field inside the semiconductor substrate 1 becomes minimum when the injection amount of the embedded injection layer 18 is $0.9 \times 10^{13}$ cm$^{-2}$, and the substrate surface electric field of the end of the termination structure becomes larger as the injection amount of the embedded injection layer 18 becomes higher.

When the injection amount of the embedded injection layer 18 is 0.4 to $0.9 \times 10^{13}$ cm$^2$ (about 0.4 to 0.9 times the resurf condition), the maximum electric field inside the semiconductor can be suppressed to smaller than or equal to 3.0 MV/cm and the substrate surface electric field of the end of the termination structure can be suppressed to smaller than or equal to the 1.5 MV/cm.

The effects in terms of manufacturing can also be obtained according to the configuration of the present invention. These will be described below.

Since the main object of arranging the embedded injection layer 18 is to connect the base 2 and the guard rings 11 to 16, resolution and alignment accuracy associated with the embedded injection layer 18 of a few μm is sufficient.

Therefore, the embedded injection layer can be easily formed even when the high-definition guard ring needs to be formed as in the wide band gap semiconductor. In particular, a considerably thick resist mask is used when forming the embedded injection layer with the high energy impurity injection, but problems of the resolution do not arise in such a configuration.

Furthermore, in this configuration, since the concentration profile having a peak of the embedded injection layer 18 can be actively used, the impurity diffusion by the anneal processing and the plurality of impurity injections with different injection energy are not necessary.

That is, the configuration is extremely effective with respect to the wide band gap semiconductor such as SiC in which the impurity diffusion length is extremely short. Furthermore, even with the material such as Si in which the impurity diffusion is possible, the configuration can be used to reduce the tact time such as shortening the anneal time.

The effects described above are also applicable in modifications of the present invention described below.

First Modification

Figure 7:
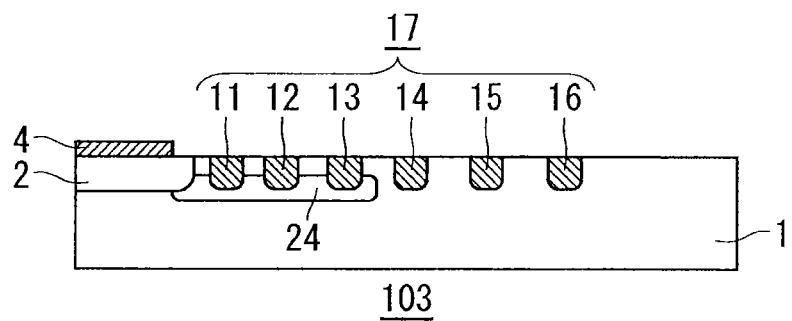
FIG. 7 is a cross-sectional view showing a configuration of a first modification of the semiconductor device of the first embodiment according to the present invention.

FIG. 7 is a cross-sectional view showing a termination structure 103 according to a first modification of the first embodiment. The base 2 and part of guard rings, the guard rings 11 to 13, are connected by an embedded injection layer 24. The guard rings 14 to 16 of the guard ring structure 17 are not connected to the embedded injection layer 24.

This configuration can be used to suppress the stretch of the depletion layer when the depletion layer tends to stretch excessively to the outer side when all the guard rings are connected.

Second Modification

Figure 8:
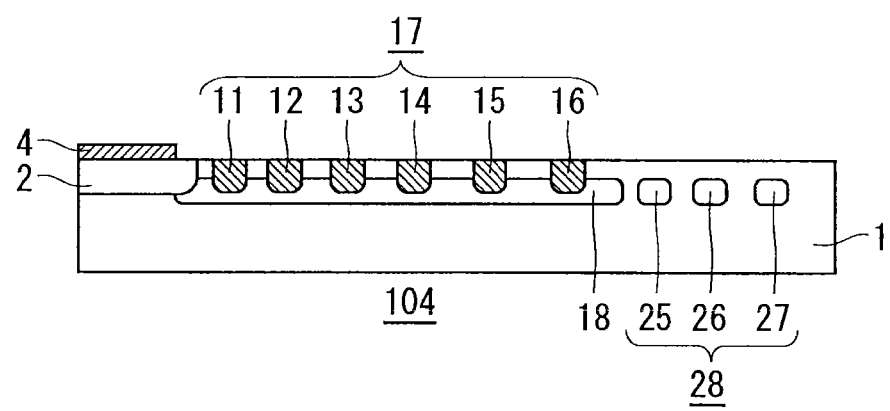
FIG. 8 is a cross-sectional view showing a configuration of a second modification of the semiconductor device of the first embodiment according to the present invention.

FIG. 8 is a cross-sectional view showing a termination structure 104 according to a second modification of the first embodiment. In addition to the embedded injection layer 18 of the termination structure 101 of the first embodiment, an embedded guard ring structure 28 (third impurity region) including embedded guard rings 25 to 27 embedded in the surface layer of the semiconductor layer is formed in a region on the outer side in plan view of the guard ring structure 17 (first impurity region) surrounding the base 2.

The embedded guard rings 25 to 27 (third impurity region) of the second conductivity type are embedded inside the semiconductor substrate 1, similar to the embedded injection layer 18 (embedded at the same depth as the embedded injection layer 18 in the figure), and are formed spaced apart from each other to surround the guard ring structure 17, as shown in the figure.

This configuration can be adopted to stretch the depletion layer and improve the breakdown voltage when sufficient breakdown voltage cannot be obtained with the termination structure 101.

The voltage held by the guard ring structure 17 can also be assigned to the embedded injection layer 18 and the embedded guard ring structure 28 (embedded guard rings 25 to 27) to further alleviate the electric field concentration inside the semiconductor and increase the breakdown voltage.

Effects

According to the embodiment of the present invention, the semiconductor device includes the base 2 as the active area of the second conductivity type formed on the surface layer of the semiconductor layer of the first conductivity type to constitute the semiconductor element, the guard rings 11 to 16 as a plurality of first impurity regions of the second conductivity type formed on the surface layer of the semiconductor layer spaced apart from each other so as to respectively surround the base 2 in plan view, and the embedded injection layer 18 as the second impurity region of the second conductivity type embedded in the surface layer of the semiconductor layer to connect at least two of the bottom portions of the plurality of guard rings 11 to 16. Accordingly, even if the guard rings formed at a narrow interval are arranged, the semiconductor device having high breakdown voltage and high reliability can be provided by utilizing the performance of the guard ring structure 17 without using the injection layer formed with satisfactory position accuracy.

In other words, since the main object of arranging the embedded injection layer 18 is to connect the plurality of guard rings 11 to 16, the resolution and the alignment accuracy thereof of a few μm is sufficient, whereby the semiconductor device having high breakdown voltage and high reliability can be provided without having to form the injection layer with satisfactory position accuracy.

The guard rings 11 to 16 connected by the embedded injection layer 18 have equal potential until the embedded injection layer 18 is completely depleted. As a result, the depletion layer can be easily connected to the outermost guard ring 16. Thus, high breakdown voltage and high reliability can be realized.

Furthermore, the electric field is alleviated at the bottom end portions of the guard rings 11 to 16 covered by the embedded injection layer 18. The concentration of the embedded injection layer 18 can be increased in accordance with the depth (injection depth) of the bottom portions of the guard rings 11 to 16, and the effect of alleviating the electric field can be improved.

The embedded injection layer 18 can be formed without requiring the impurity diffusion by the anneal processing and the plurality impurity injections with different injection energy. In other words, it is extremely effective when applied to the wide band gap semiconductor such as SiC in which the impurity diffusion length is extremely short. Even with the material such as Si in which the impurity diffusion can be carried out, effects in reducing the tact time such as shortening the anneal time can be obtained.

Since the embedded injection layer 18 is embedded in the termination region, the surface electric field of the semiconductor substrate 1 of the relevant region is suppressed.

According to the embodiment of the present invention, in the semiconductor device, the embedded injection layer 18 as the second impurity region is connected to the bottom portion of the base 2 as the active area. Thus, the concentration of the embedded injection layer 18 can be increased in accordance with the depth (injection depth) of the bottom portions of the guard rings 11 to 16, and the effect of alleviating the electric field at the bottom portions can be improved.

According to the embodiment of the present invention, in the semiconductor device, the embedded injection layer 18 as the second impurity region is connected to all the bottom portions of the guard rings 11 to 16 as the plurality of first impurity regions. Thus, the depletion layer can be more easily connected to the outermost guard ring 16. Accordingly, high breakdown voltage and high reliability can be realized.

According to the embodiment of the present invention, in the semiconductor device, the embedded injection layer 18 as the second impurity region is formed further to the outer side in plan view of the guard ring 16 as the first impurity region surrounding the base 2 as the active area from the outermost side in plan view. Thus, the electric field on the outer side of the guard ring 16 surrounding the base 2 from the outermost side in plan view can be alleviated.

According to the embodiment of the present invention, the semiconductor device further includes the embedded guard rings 25 to 27 as a plurality of third impurity regions of the second conductivity type that are embedded in the surface layer of the semiconductor layer so as to be spaced apart from each other and that respectively surround the guard rings 11 to 16 as the first impurity regions in plan view. Thus, the depletion layer can be further spread, and high breakdown voltage and high reliability can be realized.

According to the embodiment of the present invention, in the semiconductor device, the embedded guard rings 25 to 27 as the third impurity regions are embedded at a depth equal to that of the embedded injection layer 18 as the second impurity region. Thus, the impurity concentration can be reduced at the substrate surface of the termination region and the alleviation of the electric field of the substrate surface can be realized.

According to the embodiment of the present invention, in the semiconductor device, the guard rings 11 to 16 as the first impurity regions are formed at the surface of the semiconductor layer. Thus, the step for forming the guard ring can be reduced.

Second Embodiment

Configuration

Figure 9:
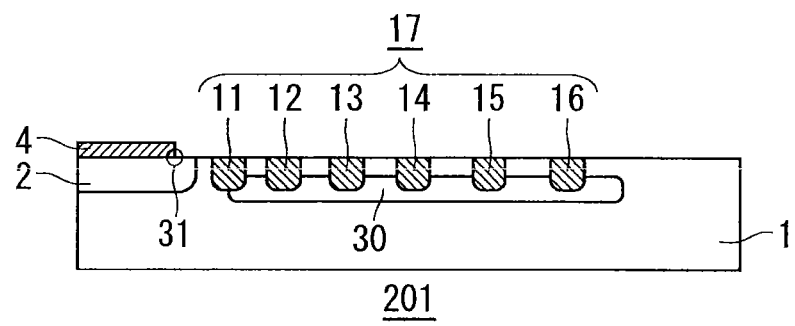
FIG. 9 is a cross-sectional view showing a configuration of a semiconductor device of a second embodiment according to the present invention.

FIG. 9 is a cross-sectional view showing a termination structure 201 according to a second embodiment of the present invention. An embedded injection layer 30 (second impurity region) connects the bottom portions of the guard rings 11 to 16, but different from the case of the first embodiment, the embedded injection layer 30 is not connected to the base 2 as the active area.

In the case of the first embodiment, since the barrier (diffusion potential) of the PN junction is lower in the embedded injection layer than in the base 2, the current first starts to flow from the embedded injection layer 18 when a forward voltage is applied (since the impurity concentration is lower in the embedded injection layer than in the base 2). Thus, the current concentration occurs at an anode electrode end 31 (see FIG. 9) closest to the termination structure, which may possibly lead to thermal destruction.

Therefore, the embedded injection layer 30 and the base 2 are separated to disconnect the current path from the embedded injection layer 30 to the anode electrode 4, so that the current path is only the base 2. As a result, the current concentration at the anode electrode end 31 can be alleviated.

However, in such a configuration, not only the guard ring structure 17 has the floating potential but also the alleviation of the electric field of the bottom end portion of the base 2 may become insufficient.

Figure 10:
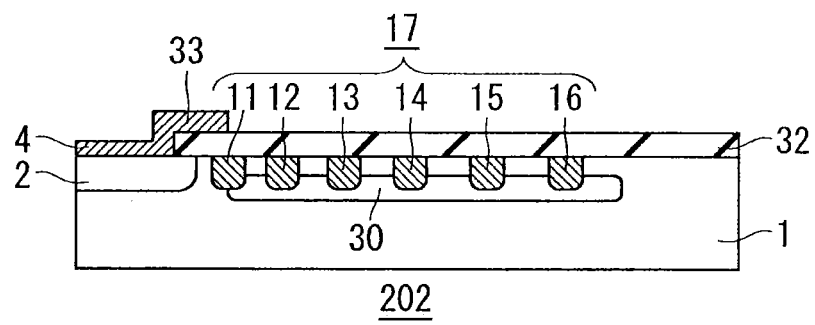
FIG. 10 is a cross-sectional view showing a configuration of another mode of the semiconductor device of the second embodiment according to the present invention.

Thus, as in a termination structure 202 shown in FIG. 10, the anode electrode 4 may be extended above the guard ring 11 (first impurity region on the innermost side) with an insulating film 32 interposed therebetween, and a field plate 33 as a wiring layer may be formed. According to such a structure, the potential of the guard ring structure 17 can be brought close to the potential of the base 2, and the electric field concentration at the bottom end portion of the base 2 can be alleviated at the time of reverse voltage application.

In the second embodiment, the configuration similar to that shown in the first embodiment, for example, the configuration of connecting part of the guard rings as shown in FIG. 7 (may be configuration of connecting at least two guard rings), or the configuration of further including the embedded guard ring in the region on the outer side in plan view as shown in FIG. 8 may be applied to the embedded injection layer 30.

Effects

According to the embodiment of the present invention, in the semiconductor device, the embedded injection layer 30 as the second impurity region is not connected to the base 2 as the active area. Thus, the current concentration to the anode electrode 4 at the time of forward voltage application can be suppressed.

According to the embodiment of the present invention, in the semiconductor device, the field plate 33 as the wiring layer connected to the base 2 as the active area is arranged on the guard ring 11 as the first impurity region on the innermost side with the insulating film 32 interposed therebetween.

Thus, the electric field concentration at the bottom end portion of the base 2 can be alleviated at the time of reverse voltage application.

Third Embodiment

Configuration

Figure 11:
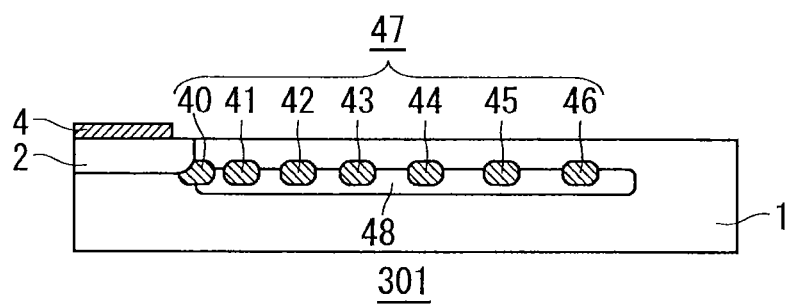
FIG. 11 is a cross-sectional view showing a configuration of a semiconductor device of a third embodiment according to the present invention.

FIG. 11 is a cross-sectional view showing a termination structure 301 according to a third embodiment of the present invention. A first embedded injection layer 47 including embedded guard rings 40 to 46 (first impurity region) injected and embedded deeper than the base 2 is formed on the outer side in plan view of the base 2. The embedded guard rings 40 to 46 are spaced apart from each other, and formed to surround the base 2 in plan view.

The bottom portions of the embedded guard rings 40 to 46 are connected by a second embedded injection layer 48 injected deeper than the embedded guard rings 40 to 46. The first embedded injection layer 47 has a maximum concentration in the vicinity of the bottom portion of the base 2, and the second embedded injection layer 48 has a maximum concentration in the vicinity of the bottom portion of the first embedded injection layer 47.

The injection amount of the first embedded injection layer 47 is about 1 to 2 times the resurf condition, and the injection amount of the second embedded injection layer 48 is about 0.4 to 0.9 times the resurf condition. In manufacturing such a configuration, although the number of masks increases than in the first embodiment and the second embodiment, the injection amount and the concentration of the first embedded injection layer 47 can be greatly lowered than the base 2 when forming. Hence, the electric field concentration caused by the change in concentration between the bottom end portions of the embedded guard rings 40 to 46 and the second embedded injection layer 48 can be suppressed.

Since the concentration of the first embedded injection layer 47 is relatively high as compared to the second embedded injection layer 48, the effect in which the first embedded injection layer 47 alleviates the change in concentration of the bottom end portion of the base 2 is greater than in the first embodiment and the second embodiment.

In such a configuration, the electric field concentration that occurs on the inner side bottom end portion of the embedded guard ring 40 (portion below the base 2) becomes slightly larger than in the first embodiment and the second embodiment.

Figure 12:
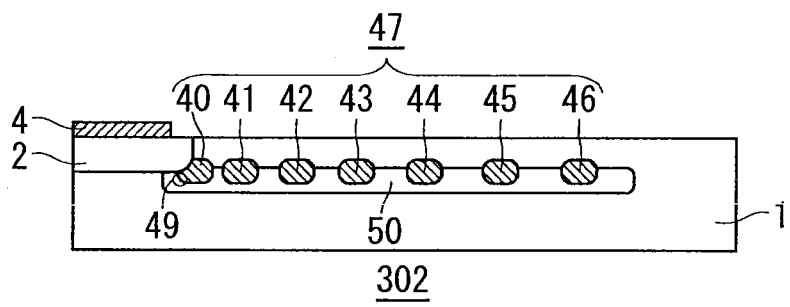
FIG. 12 is a cross-sectional view showing a configuration of another mode of the semiconductor device of the third embodiment according to the present invention.

Thus, as in a termination structure 302 shown in FIG. 12, the electric field concentration that occurs at an inner side bottom end portion 49 of the embedded guard ring 40 can be suppressed by forming a second embedded injection layer 50 to the inner side of the embedded guard ring 40.

In the third embodiment, since the injection layer (first embedded injection layer 47) having an intermediate concentration (or injection amount) is formed, the electric field concentration caused by the steep change in concentration is less likely to occur as compared to the first embodiment and the second embodiment.

Modification

In the third embodiment, the following modifications can also be considered.

Figure 13:
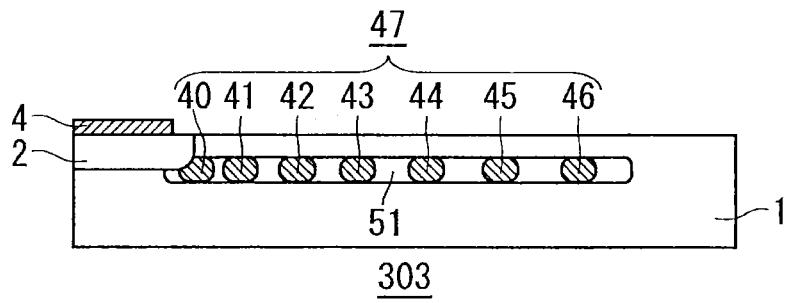
FIG. 13 is a cross-sectional view showing a configuration of a modification of the semiconductor device of the third embodiment according to the present invention.

FIG. 13 shows a modification (termination structure 303) of the third embodiment. At a position deeper than the base 2, the first embedded injection layer 47 (first impurity region) and a second embedded injection layer 51 (second impurity region) are formed at the same depth.

Figure 14:
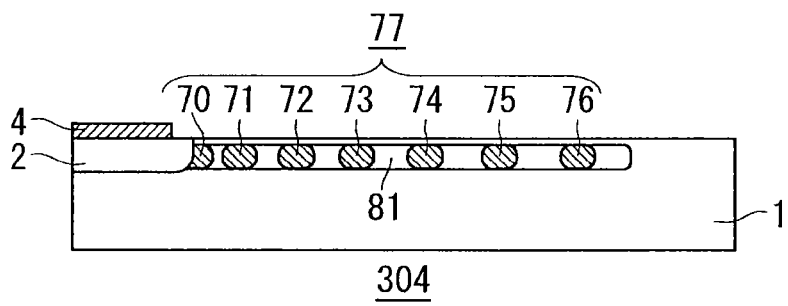
FIG. 14 is a cross-sectional view showing the configuration of the modification of the semiconductor device of the third embodiment according to the present invention.

FIG. 14 shows a modification (termination structure 304) of the third embodiment. A first embedded injection layer 77 including embedded guard rings 70 to 76 and a second embedded injection layer 81 are formed substantially at the same depth as the base 2. The second embedded injection layer 81 (second impurity region) and the base 2 (active area) are connected.

Such configurations are useful when the maximum energy of the injector is low or when maximum energy is required to form the base.

In the third embodiment, the configuration similar to that shown in the first embodiment and the second embodiment, for example, the configuration of connecting part of the guard rings as shown in FIG. 7, or the configuration of further including the embedded guard ring in the region on the outer side in plan view as shown in FIG. 8 may be applied to the second embedded injection layer. The configuration in which the first embedded injection layer and the base 2 are spaced apart may also be applied.

Effects

According to the embodiment of the present invention, in the semiconductor device, the second embedded injection layer 51 as the second impurity region is connected to the base 2 as the active area. Thus, the depletion layer can be further easily connected to the outermost guard ring 46. Accordingly, high breakdown voltage and high reliability can be realized.

According to the embodiment of the present invention, in the semiconductor device, the embedded guard rings 40 to 46 as the first impurity region are embedded and formed at the surface layer of the semiconductor layer. Thus, the electric field concentration can be further alleviated.

According to the embodiment of the present invention, in the semiconductor device, the embedded guard rings 40 to 46 as the first impurity region and the second embedded injection layer 51 as the second impurity region are embedded and formed. Thus, the impurity concentration can be lowered at the substrate surface of the termination region, and the electric field of the substrate surface can be alleviated.

Fourth Embodiment

Configuration

Figure 15:
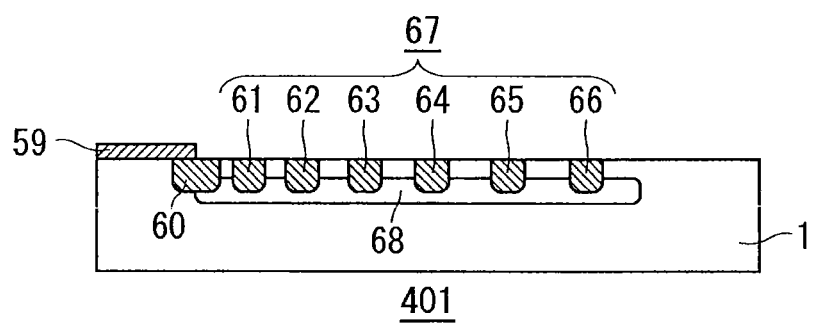
FIG. 15 is a cross-sectional view showing a configuration of a semiconductor device of a fourth embodiment according to the present invention.

FIG. 15 is a cross-sectional view showing a termination structure 401 according to a fourth embodiment of the present invention. FIG. 15 shows the termination structure of schottky barrier diode, but the configuration similar to the configurations shown in the first to third embodiments can be applied by assuming an injection layer 60 positioned below the end of a schottky electrode 59 as a base of the PIN diode.

The modifications shown in the first to third embodiments may be applied on the illustrated structure including a guard ring structure 67, which includes guard rings 61 to 66, and an embedded injection layer 68 for connecting each of the guard rings 61 to 66.

However, if the schottky barrier is lower than that of the PN junction, the configuration of the second embodiment does not need to be adopted.

Other Application Examples

In the first to fourth embodiments, the number of guard rings is fixed, but the number of guard rings changes depending on the breakdown voltage to be obtained, individual guard ring width, and individual guard ring interval. Generally, greater number of guard rings is necessary as the breakdown voltage becomes higher. This is similar in the embedded guard ring formed simultaneously with the embedded injection layer shown in FIG. 8, for example.

In the first to fourth embodiments, the guard ring structure has been described such that the guard ring interval gradually becomes wider while a guard ring width is constant, but the guard ring width may be gradually reduced. Generally, the guard ring structure is formed such that "guard ring width/ guard ring interval" becomes smaller toward the outer side.

In the first to third embodiments, the configuration applied to the PIN diode constituted by the N-type semiconductor substrate and the P-type injection layer has been described, but similar effects can be obtained even if the conductivity type of the entire semiconductor device is reversed.

Furthermore, similar effects can be obtained when the configuration is applied not only to the PIN diode but also to transistors such as MOSFET, IGBT, BJT (Bipolar Junction Transistor), and the like.

In the fourth embodiment, the configuration applied to the schottky barrier diode constituted by the N-type semiconductor substrate and the schottky barrier has been described, but similar effects can be obtained even if the conductivity type of the entire semiconductor device is reversed.

The semiconductor substrate is not limited to Si and SiC, and a semiconductor having a wide band gap, for example, a substrate constituted by gallium nitride material or diamond may be used. The optimum injection amount of the embedded injection layer is determined by the dielectric constant and the insulation breakdown electric field of the semiconductor material that is mainly used.

The switching element and the diode element constituted by such a wide band gap semiconductor have high voltage resistance and high allowable current density, and thus can be miniaturized compared to Si. Through use of the miniaturized switching element and diode element, the semiconductor device module incorporating such elements can be miniaturized.

Moreover, due to high heat resistance, the radiation fin of the heat sink can be miniaturized and cooling not by water cooling but by air cooling can be carried out. Hence, the semiconductor device module can be further miniaturized.

The impurity used in the injection may be any substance as long as it replaces the atoms of the semiconductor material to activate, such as B (boron), N (nitrogen), Al (aluminum), P (phosphorous), As (arsenic), In (indium), and the like. However, if the impurity has a large diffusion length, the change in concentration is more gradual at the interface of the regions of different injection amounts, and the electric field concentration is alleviated. Thus, in the case of the N-type semiconductor substrate, more satisfactory effects can be expected by injecting B (boron) and Al (aluminum) to form the P-type injection layer.

In the embodiments of the present invention, quality of material, material, implementing conditions, and the like of each constituent element have been described, but these are merely illustrative and are not to be limited to those described above.

In the present invention, each embodiment can be freely combined, arbitrary constituent elements of each embodiment can be modified, or arbitrary constituent elements can be omitted in each embodiment within the scope of the present invention.

While the present invention has been described in detail, the foregoing description is in all aspects illustrative and not restrictive. It is therefore understood that numerous modifications which are not illustrated can be devised without departing from the scope of the invention.

1 semiconductor substrate
2 base
3 termination region
4 anode electrode
5 cathode electrode
11 to 16, 61 to 66 guard ring
17, 67 guard ring structure
18, 24, 30, 68 embedded injection layer
19 P-type region
20 PN junction surface
21 passivation film
22 outer side end
23 substrate surface
25 to 27, 40 to 46, 70 to 76 embedded guard ring
28 embedded guard ring structure
31 anode electrode end
32 insulating film
33 field plate
47, 77 first embedded injection layer
48, 50, 51, 81 second embedded injection layer
49 inner side bottom end portion
59 schottky electrode
60 injection layer
100 diode
101 to 104, 201, 202, 301 to 304, 401 termination structure

The invention claimed is:

1. A semiconductor device comprising:
an active area of a second conductivity type formed on a top surface of a semiconductor layer of a first conductivity type to constitute a semiconductor element;
a plurality of first regions of the second conductivity type formed on said semiconductor layer spaced apart from each other so as to respectively surround said active area in plan view; and
a second impurity region of the second conductivity type embedded in said semiconductor layer to connect at least two bottom portions of said plurality of first impurity regions,
wherein said second impurity region is connected to a bottom portion of said active area, and wherein a top surface of said second impurity region is not coplanar with the top surface of the semiconductor layer.

2. A semiconductor device comprising:
an active area of a second conductivity type formed on a top surface of a semiconductor layer of a first conductivity type to constitute a semiconductor element;
a plurality of first impurity regions of the second conductivity type formed on said semiconductor layer spaced apart from each other so as to respectively surround said active area in plan view; and
a second impurity region of the second conductivity type embedded in said semiconductor layer to connect at least two bottom portions of said plurality of first impurity regions,
wherein said second impurity region has an impurity concentration lower than said first impurity region, and
wherein a to surface of said second impurity region is not coplanar with the to surface of the semiconductor layer.

3. The semiconductor device according to claim 2, wherein said second impurity region is connected to said active area.

4. The semiconductor device according to claim 2, wherein said second impurity region is not connected to said active area.

5. The semiconductor device according to claim 2, wherein said second impurity region is connected to all bottom portions of said plurality of first impurity regions.

6. The semiconductor device according to claim 5, wherein said second impurity region is formed further to an outer side in plan view of said first impurity region surrounding said active area from an outermost side in plan view.

7. The semiconductor device according to claim 2, wherein said first impurity regions are formed on said top surface of the semiconductor layer.

8. The semiconductor device according to claim 7, further comprising a wiring layer connected to said active area on said first impurity region on an innermost side with an insulating film interposed therebetween.

9. The semiconductor device according to claim 2, wherein said first impurity regions are formed by being embedded in said surface layer of the semiconductor layer.

10. The semiconductor device according to claim 9, wherein said first impurity regions are formed by being embedded at a depth equal to that of said second impurity region.

11. The semiconductor device according to claim 2, wherein said semiconductor element is a schottky barrier diode, and an end of said active area is an injection layer of the second conductivity type arranged at an end of a schottky electrode.

12. A semiconductor device comprising:
   an active area of a second conductivity type formed on a surface layer of a semiconductor layer of a first conductivity type to constitute a semiconductor element;
   a plurality of first impurity regions of the second conductivity type formed on said surface layer of the semiconductor layer spaced apart from each other so as to respectively surround said active area in plan view; and
   a second impurity region of the second conductivity type embedded in said surface layer of the semiconductor layer to connect at least two bottom portions of said plurality of first impurity regions; and
   a plurality of third impurity regions of the second conductivity type embedded in said surface layer of the semiconductor layer to be spaced apart from each other to respectively surround said first impurity regions in plan view.

13. The semiconductor device according to claim 12, wherein said third impurity regions are embedded at a depth equal to that of said second impurity region.

* * * * *